United States Patent [19]

Nozuyama et al.

[11] Patent Number: 5,515,517
[45] Date of Patent: May 7, 1996

[54] DATA PROCESSING DEVICE WITH TEST CIRCUIT

[75] Inventors: Yasuyuki Nozuyama; Kazuhiko Ohashi, both of Tokyo, Japan

[73] Assignee: Kabushiki Kaisha Toshiba, Kawasaki, Japan

[21] Appl. No.: 357,052

[22] Filed: Dec. 14, 1994

Related U.S. Application Data

[63] Continuation of Ser. No. 689,329, Apr. 23, 1991, abandoned.

[30] Foreign Application Priority Data

Apr. 24, 1990 [JP] Japan ................. 2-106429

[51] Int. Cl.$^6$ ........................................ G06F 11/26
[52] U.S. Cl. ................. 395/325; 395/311; 371/22.1
[58] Field of Search ........................ 395/325, 275, 395/800; 371/22.5, 22.6, 22.1, 22.3, 15.1, 16.1

[56] References Cited

U.S. PATENT DOCUMENTS

| | | | |
|---|---|---|---|
| 4,495,573 | 1/1985 | Ballegeer et al. | 395/325 |
| 4,511,958 | 4/1985 | Funk | 395/325 |
| 4,535,330 | 8/1985 | Carey et al. | 395/325 |
| 4,825,439 | 4/1989 | Sakashita et al. | 371/22.1 |
| 4,910,735 | 3/1990 | Yamashita | 371/22.1 |
| 4,973,904 | 11/1990 | Sonnek | 371/22.1 |
| 4,980,889 | 12/1990 | DeGuise et al. | 371/22.1 |
| 4,984,195 | 1/1991 | Nakamura et al. | 395/325 |
| 4,987,529 | 1/1991 | Craft et al. | 395/325 |
| 5,019,970 | 5/1991 | Yamaguchi et al. | 395/375 |
| 5,034,881 | 7/1991 | Hoashi et al. | 395/325 |
| 5,101,498 | 3/1992 | Ehlig et al. | 395/800 |
| 5,115,435 | 5/1992 | Langford, II et al. | 371/22.1 |
| 5,157,781 | 10/1992 | Harwood et al. | 371/22.3 |
| 5,159,263 | 10/1992 | Yaguchi | 371/15.1 |
| 5,210,864 | 5/1993 | Yoshida et al. | 395/575 |
| 5,247,521 | 9/1993 | Akao et al. | 371/22.1 |
| 5,331,571 | 7/1994 | Aronoff et al. | 371/22.1 |

FOREIGN PATENT DOCUMENTS 2633756  1/1990  France ................. G06K 19/00

OTHER PUBLICATIONS

Testability Features of the MC68332 Modular Microcontroller, W. Harwood et al., Proceedings of the International Test Conference, Aug. 29–31, 1989, pp. 615–623, New York, U.S.

System–und Software–Architektur des Multibus–II, F. Furrer, Elektronik, vol. 37, No. 21, Oct. 1988, pp. 78–84, Munchen de (an English abstract is attached to this document).

A Universal Test and Maintenance Controller for Modules and Boards, J-C Lien et al., IEEE Transactions On Industrial Electronics and Control Instrumentation, vol. 36, No. 2, May 1989, New York, U.S., pp. 231–240.

Primary Examiner—Glenn A. Auve
Attorney, Agent, or Firm—Foley & Lardner

[57] ABSTRACT

A data processing device with a test circuit has a plurality of macro blocks, a common bus for transferring the output of one of the macro blocks to the other macro blocks, and a tri-state buffer incorporated into each macro block. A bus control circuit selects the tri-state buffer in a normal operation mode in which the device performs its normal functions, in order to transfer the information stored in the macro block corresponding to the tri-state buffer selected by the bus control circuit to the common bus. A selecting control circuit, which includes a selector, an AND gate, and a flip-flop (F/F), is used for selecting the tri-state buffer in a test operation mode which the device has entered, then for transferring the information stored in the macro block corresponding to the tri-state buffer selected by the selecting control circuit to the common bus. A F/F is provided for setting the device in either the normal operation mode or the test operation mode. In the data processing device according to the present invention, in addition to the bus control circuit, which is used in the normal operation mode, the selecting control circuit, which is used in the test operation mode, is provided, so that the efficiency of the test vector generation is greatly improved.

3 Claims, 3 Drawing Sheets

1

DATA PROCESSING DEVICE WITH TEST CIRCUIT

This application is a continuation, of application Ser. No. 07/689,329, filed Apr. 23, 1991, now abandoned.

BACKGROUND OF THE INVENTION

1. Field of the Invention

This invention relates to a data processing device with a test circuit with which the test vectors of a scan test for functional elements such as a plurality of macro blocks connected to a common bus can be generated very efficiently.

2. Description of the Prior Art

Functional elements (hereinafter referred to as macro blocks) each including an adder, an arithmetic and logic calculation unit, a random access memory (RAM), and a read only memory (ROM), and others combinational circuits or sequential circuits are connected to an address bus or a data bus to transfer data stored in the macro blocks in a data processing device, such as a microprocessor.

In general, there are two types of data transfer control methods for the microprocessor. The first method, for example, is executed by using a microprogram. In the first method, input/output operation for data is performed through a common bus under the control of one control block. In the second method, the data input-output operation is controlled through the common bus under the control of plural control blocks. Both the first and second methods are commonly used in conventional microprocessor devices including large scale, complicated and integrated circuits.

In these conventional microprocessor devices, only one macro block is selected for the data output operation through a common bus to prohibit the data output operation by other macro blocks.

The control operation for the data input/output operation, as described above, is used in a conventional microprocessor device to avoid conflict between data provided by the two or more macro blocks on the common bus (bus data conflict).

It is almost impossible, to thoroughly test conventional microprocessor device using the second method in the normal operation mode, using only test instructions and data provided from outside the microprocessor device. This is because the microprocessor device includes a great number of functional elements and the control operations among the functional elements are much more complicated than in the first data transfer control method. Normal operation mode, as used herein, means that mode in which a microprocessor device operates to execute its normal functions.

As a solution for the above problem, in general, a scan design method has been adopted to test the dominant part of the microprocessor device. The main point of that scan design method is that, the flip-flop (F/Fs) of the functional elements, the macro blocks and the like, and an input terminal and an output terminal of the microprocessor device, are connected in series and operate as if each of them are a part of a shift register directly connected to the outside the device in a 'scan' operation mode.

In more detail, a scan test (operation) with a test vector in the scan design method is carried out as follows:

(1) a test vector is set in series from the outside of the device through the chain of F/Fs in the scan operation mode, (2) one cycle of the test operations of the functional elements, the macro blocks and the like, is carried out in the normal operation mode, and (3) resultant test data stored in the F/Fs is read out to the outside of the device again in the scan operation mode.

As explained above, in the scan operation mode based on the scan design method, the test vectors and the resultant test data are transferred in series into the F/Fs and out of the F/Fs, respectively.

As a result, though test operations for the sequential circuits incorporated in the microprocessor device are correctly executed by using the scan design method, the test operations take much time.

In the prior art, a special test method other than the scan design method is therefore utilized for testing operations of macro blocks such as ROM, RAM and other memory devices. This reduces the test time required for testing operation of the devices in the conventional microprocessors.

The scan design method is used for a macro block, such as a control logic ,unit and other kinds of the macro blocks, which are mainly composed of random logic circuits and F/Fs.

The data output control operation for a data processing device in which a scan test (in which a test vector is set in the device by the scan operation based on the scan design method, the test operation for the device is carried out, and then resultant test data is read out to the outside of the device) can be carried out using the scan design method, is explained with reference to FIG. 1.

The scan test for the functional blocks can be executed by the data output operation based on the scan design method.

FIG. 1 is a block diagram showing the configuration of the main part of the data processing device in which the scan test operation can be executed. In the same diagram, outputs of the macro blocks 1a and 1b are transferred alternately into a common bus 4 through a pair of bus buffers 3a and 3b under the control of a bus control circuit 2. The bus control circuit 2 includes a random logic circuit and, in some cases, a micro instruction control circuit and the like. One of the bus buffers 3a and 3b is selected by the bus control circuit 2. The functional blocks 1a and 1b may have data input paths from the common bus 4, which are depicted as paths 50a and 50b, respectively.

In the scan test, for example, the test vectors, which are generated automatically by a Computer Aided Testing (CAT) system based on the D-algorithm, are provided to the macro blocks 1a and 1b, and the bus control circuit 2 in the scan operation mode. Next, only one cycle of the normal operation of the data processing device is executed, then the resultant test data of the execution are stored temporarily in a resister 5, which is connected to the common bus 4, or registers in the macro blocks 1a and 1b (not shown).

The resultant test data are read out in series through the resister 5 or the registers in the macro blocks 1a and 1b, and through an output terminal to the outside of the device in the scan operation mode.

Four cases for controlling output operations from the macro blocks 1a and 1b to the common bus 4 through the bus buffers 3a and 3b by the bus control circuit 2 in the scan test operation, are as follows:

(1) the output from the macro block 1a is transferred to the common bus 4 through the bus buffer 3a, which is only in the active state under the control of the bus control circuit 2, (2) the output from the macro block 1b is transferred to the common bus 4 through the bus buffer 3b, which is only in the active state under the control of the bus control circuit 2.

(3) the outputs from the macro blocks 1a and 1b cannot be transferred to the common bus 4 through the bus buffers 3a and 3b, both of which are in the inactive state under the control of the bus control circuit 2, and (4) the outputs from the macro blocks 1a and 1b are transferred to the common bus 4 through the bus buffers 3a and 3b, both of which are in the active state under the control of the bus control circuit 2.

In general, the frequency at which each of the four states described above is generated by an automatic test vector generator is approximately equal in the scan test operation in the conventional data processing device.

There is no advantage in executing the scan test operations under the two states (3) and (4), because no outputs obtained from the macro blocks 1a and 1b are transferred to the common bus 4 in the state (3). In the state (4), the outputs from the macro blocks 1a and 1b will conflict on the common bus 4. Accordingly, test vectors with the states (3) and (4) have to be excluded from a set of test vectors giving useful information on the faults of the device.

As shown in FIG. 1, in the case where there are two macro blocks which output to the common bus 4, there are the four states for transferring the outputs of the macro blocks under the control of the bus control circuit 2.

The frequency that each state (1), (2), (3), or (4) is generated in automatic test vector generation is nearly the same, so that test vectors giving resultant test data can be obtained only twice in the meaningful generation of the four test vectors with the four states (1), (2), (3), or (4).

In general, test vectors giving meaningful results in the scan test operation can be obtained at a rate of N times in $2^N$ time scan test vector generation, when the N (N is an integer) macro blocks are connected to the common bus. Therefore the occurrence probability of useful test vectors obtained in the automatic scan test vector generation for the conventional data processing device in which the N of $2^N$ is two or more is lower than 1.

The greater the number of the macro blocks, the more time it takes to generate useful scan test vectors applicable to the device.

In the prior art, checking operations for detecting whether or not generated test vectors cause data conflict or hi-impedance on a common bus are necessary, in order to obtain useful test vectors after test vectors are generated by the CAT. When these undesirable states occur, the corresponding test vectors are excluded from a set of test vectors applied to the device.

Thus, in the prior art, the test vectors by which only one buffer is placed in the active state are selected after all possible test vectors are generated. However, as described above, it takes much time to generate all possible test vectors for the conventional data processing device. Further, the rate of the useful test vectors in all generated test vectors made by the CAT is lower reducing, the efficiency of the test vector generation.

SUMMARY OF THE INVENTION

An object of the present invention is to solve this problem of the prior art by providing a data processing device with a test circuit by which test vectors for test operations are generated in a short time and the efficiency of the test generation can be increased.

A data processing device with a test circuit according to the present invention includes a plurality of functional elements and a common bus for transferring the output of each functional block to other ones. An output control means incorporated into each functional element is used for transferring the output to the common bus. A first selection control means is provided for selecting the output control means in a normal operation mode in which the device performs its normal functions, then for transferring the output of the functional block corresponding to the output control means selected by the first selection control means to the common bus. A second selection control means is provided for selecting the output control means in a test operation mode which the device has entered, then for transferring the output of the functional block corresponding to the output control means selected by the second selection control means to the common bus. A mode setting means is provided for setting the functional blocks, the first selecting control means, the second selection control means, and the output control means, as the construction elements of the device, in either the normal, operation mode or the test operation mode.

In addition to the first selection control means, which is used in the normal operation mode, the second selection control means, which is used in the test operation mode, is incorporated in the data processing device according to the present invention, so that the efficiency of generating useful test vectors for the data processing device can be greatly improved.

These and other objects, features and advantages of the present invention will be more apparent from the following description of a preferred embodiment, taken in conjunction with the accompanying drawings.

DETAILED DESCRIPTION OF THE EMBODIMENT

A preferred embodiment according to the present invention will now be explained.

Figure 2:
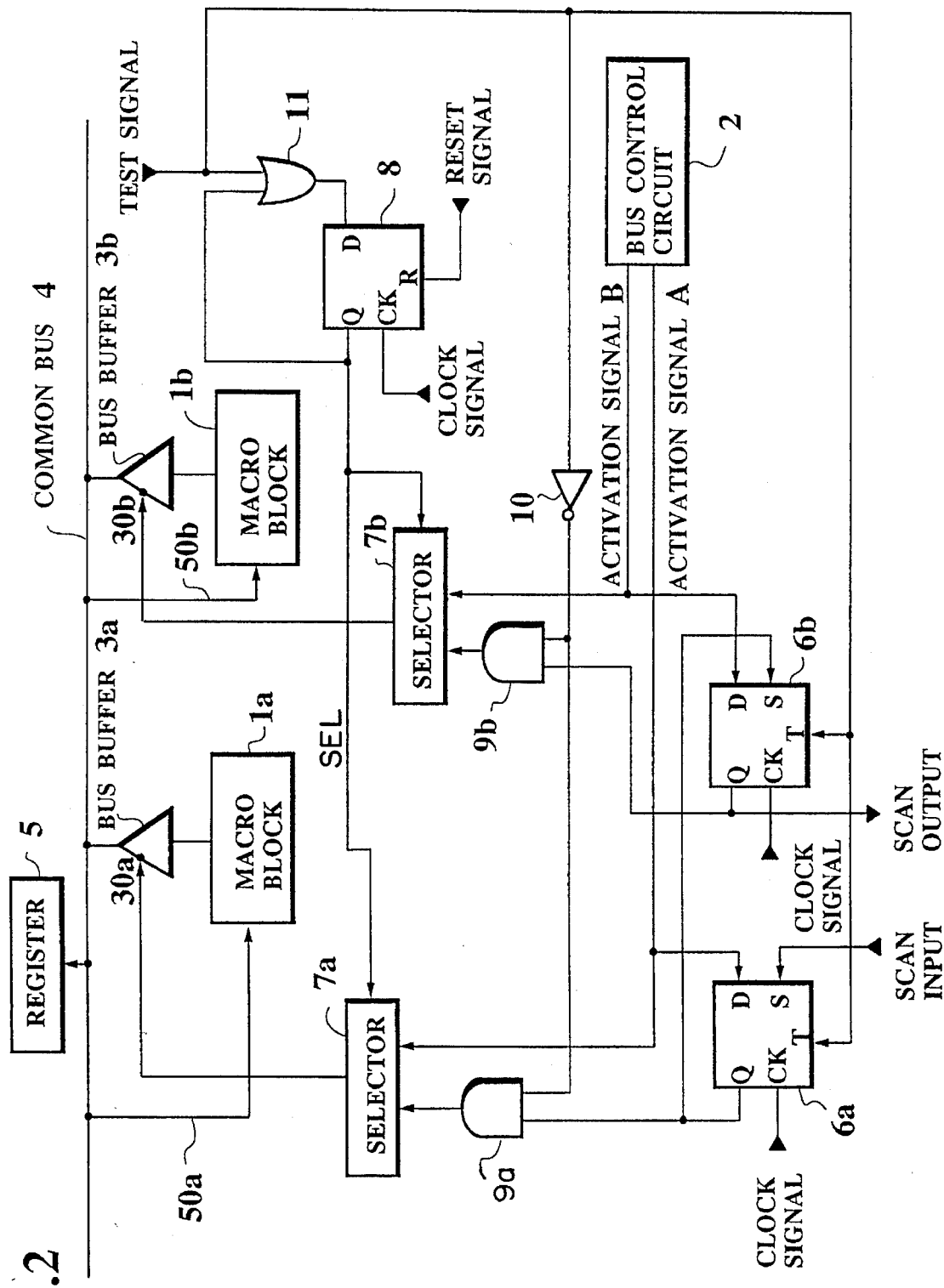
FIG. 2 is a schematic block diagram of a data processing device with a test circuit according to the present invention.

FIG. 2 is a schematic block diagram of parts of a data processing device with a test circuit according to the present invention. The same diagram shows macro blocks 1a and 1b and other constructional elements which are used for a scan test operation of the data processing device according to the present invention.

As compared with the normal operation mode used in a conventional data processing device, the data processing device shown in FIG. 2, further includes a test operation mode which differs from the normal operation mode and in which the bus buffers 3a and 3b, as shown in FIG. 2, are not controlled by the bus control circuit 2. Namely, in the data processing device shown in FIG. 2, output data transferred from the bus buffers 3a and 3b to the common bus 4 are controlled in two operation modes—the normal operation mode and the test operation mode.

The test operation mode will now be explained in more detail. The data processing device with a test circuit according to the present invention operates in three operation modes—the normal operation mode, the scan operation mode (which are also used in the conventional data processing device), and the test operation mode. An instruction from an external device is executed in the normal operation mode of the data processing device. In the scan operation mode, the F/Fs incorporated in the device can operate to set test vectors or read out the resultant test data.

In the test operation mode, the action of the bus buffers Is controlled by control data from an external device set in the scan operation mode by the scan-path method. The test operation mode handles more test vectors than the normal operation mode. Namely, test vectors which are never used in the normal operation mode are generated for the test operation mode for detecting troubled nodes in the macro blocks and others by the Computer Aided Testing (CAT) system.

Figure 1:
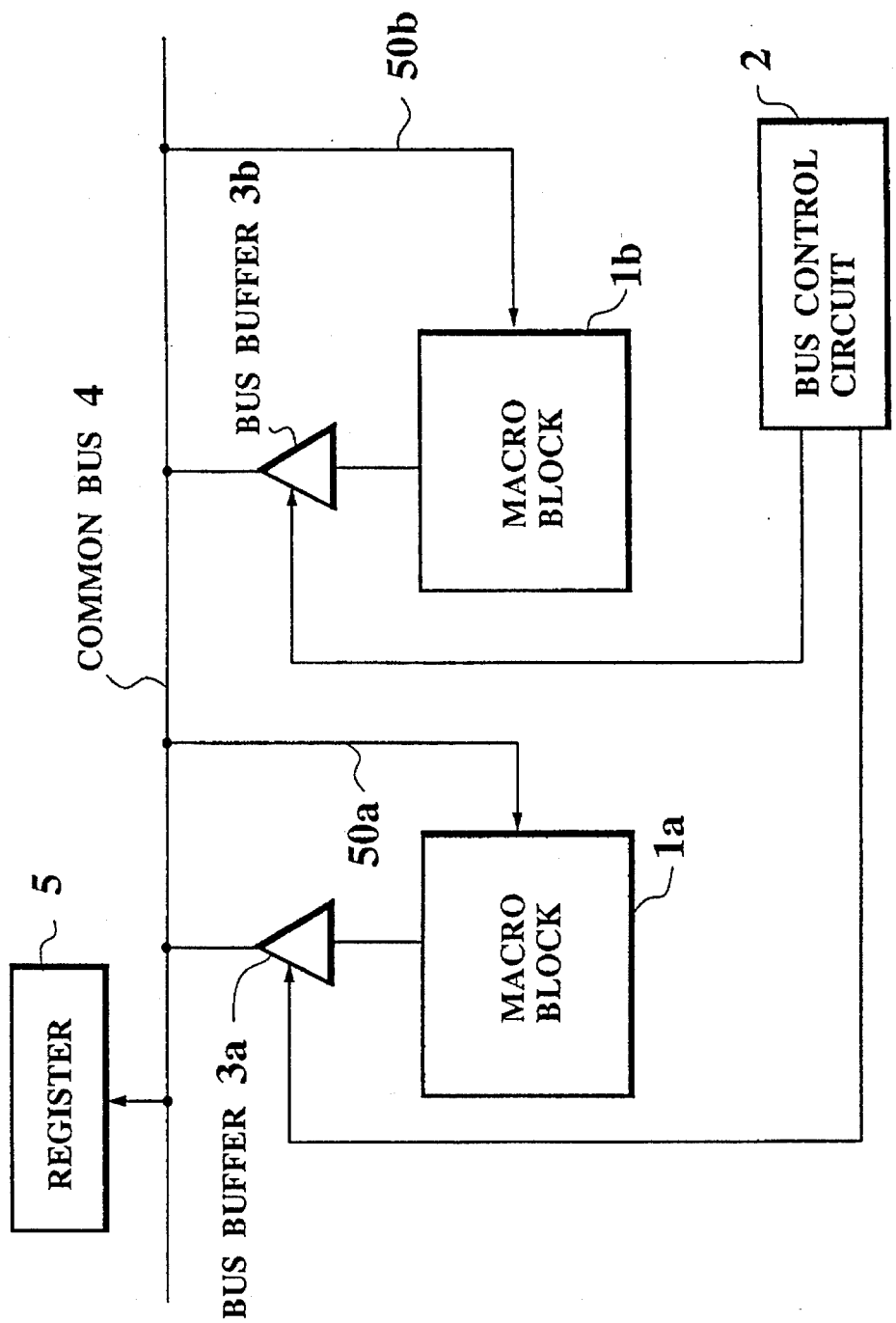
FIG. 1 is a schematic block diagram illustrating a conventional data processing device.

As compared with the data processing device shown in FIG. 1, the data processing device shown in FIG. 2 further comprises flip-flops (hereinafter called F/Fs) 6a and 6b, selectors 7a and 7b, a F/F 8, and a few logic gates. The F/Fs 6a and 6b can control the bus buffers 3a and 3b in the scan test. The control operations of the F/Fs 6a and 6b, and the bus buffers 3a and 3b, which are controlled by the bus control circuit 2, are selected by the selectors 7a and 7b in the test operation mode. The selectors 7a and 7b are controlled by the F/F 8.

The F/F 6a latches either a scanned test control input provided to its input terminal S or an activation signal A provided to its input terminal D as one of outputs of the bus control circuit 2 under the control of the test signal TEST in synchronization with a clock signal. The F/F 6a latches the scanned test control data through the input terminal S in the scan operation mode when the test signal TEST is at a high level (H). The F/F 6a latches the activation signal A through the input terminal D in the normal operation mode and the test operation mode when the test signal TEST is at a low level (L).

The F/F 6b latches either an output provided from the F/F 6a to its input terminal S or an activation signal B provided to its input terminal D as another output from the bus control circuit 2 under the control of the test signal TEST in synchronization with the clock signal. The F/F 6b latches the output from the output terminal Q of F/F 6a through the input terminal S in the scan operation mode when the test signal TEST is at a high level (H). The F/F 6b latches the activation signal B through the input terminal D in the normal operation mode and in the test operation mode when the test signal TEST is at a low level (L). The F/F 6b outputs the activation signal B or the output from the F/F 6a as a scanning output from the output terminal Q in the F/F 6b in synchronization with the clock signal in the scan operation mode.

As described above in detail, the test signal TEST is used for operating the F/Fs 6a, 6b, and 8 in the scan operation mode. As described, below, the test signal TEST is also used as a trigger signal for setting the data processing device in a test operation state.

In FIG. 2, the scan input and the scan output are directly connected to the input terminal S of the F/F 6a and the output terminal Q of the F/F 6b. But the present invention is not limited to the embodiment. For example, the above scan input and the above scan output may be connected to other scannable circuit elements in the data processing device.

The number of scan chains composed of scannable F/Fs and registers in the device may be one or more by which the transfer time of the scanning inputs or outputs can be reduced.

Thus, there are many configurations of the test circuit for executing the scan design method. In the present embodiment, one scan chain is used to provide a simplified explanation of the data processing device with the test circuit.

The scan chain for testing the macro blocks 1a and 1b, and the bus control circuit 2 comprises the F/Fs and registers. The total number of the F/Fs and the registers including the F/Fs 6a and 6b, and the resister 5 as shown in FIG. 2, and possibly those in the macro blocks 1a and 1b, and in the bus control circuit 2 (not shown), is m. Moreover. it is defined in the embodiment that the first and the second F/Fs observed from the input terminal for the scanning input are the F/Fs 6a and 6b.

The activation signal A, as the output of the bus control circuit 2, or the output of an AND gate 9a is selected under the control of a selection signal SEL and then transferred to the bus buffers 3a to control the operation of the bus buffer 3a.

The selector 7a selects the activation signal A when the selecting signal SEL is in the low state (L) and it selects the output of the AND gate 9a when the selecting signal SEL is in the high state (H) to provide this signal to the bus buffer 3a.

The output of the F/Fs 6a is transferred to one of input terminals of the AND gate 9a, and the output of an inverter 10 is provided to another input terminal of the AND gate 9a.

The activation signal B, as the output of the bus control circuit 2, or the output of an AND gate 9b is selected under the control of the selection signal SEL and then transferred to the bus buffer 3b to control the operation of the bus buffer 3b.

The selector 7b selects the activation signal B when the selecting signal SEL is in the low state (L) and it selects the output of the AND gate 9b when the selecting signal SEL is in the high state (H) to provide this signal to the bus buffer 3b.

The output of the F/Fs 6b is provided to one of the input terminals of the AND gate 9b, and the output of the inverter 10 is provided to another input terminal of the AND gate 9b.

The F/F 8 latches the output of an OR gate 11 through its input terminal D in synchronization with the clock signal in order to output the selection signal SEL through its output terminal Q.

The data stored in the F/F 8 is set at the low level (L) by a reset signal. In addition, once the test signal TEST becomes the high state (H), at a data-latch timing edge of the F/F 8, the output of the F/F 8, as the selecting signal SEL, is kept at the high level so long as the reset signal is not given to the F/F 8.

The data processing device with the testing circuit according to the present embodiment has the configuration described above. The operation of the data processing device according to the present embodiment will now be explained. First, the normal operation mode will be explained.

The data processing device enters the normal operation mode after the required elements of the data processing device are initialized by an external reset signal.

The F/F 8 is initialized by the reset signal given through its reset terminal R, then its output enters the low state (L). Thereby, either the activation signal A or B transferred from the bus control circuit 2 is selected by the selector 7a or 7b, and then provided to the bus buffer 3a or 3b.

As one of the bus buffers 3a and 3b is placed in the active state (in which the contents of the macro block 1a or 1b are read out to the common bus 4) or the inactive state (in which no contents of the macro block 1a or 1b are read out to the common bus 4) by the activation signal A or B, the contents of one of the macro blocks 1a and 1b is transferred to the common bus 4 through the bus buffer 3a or 3b which is in the active state.

Figure 3:
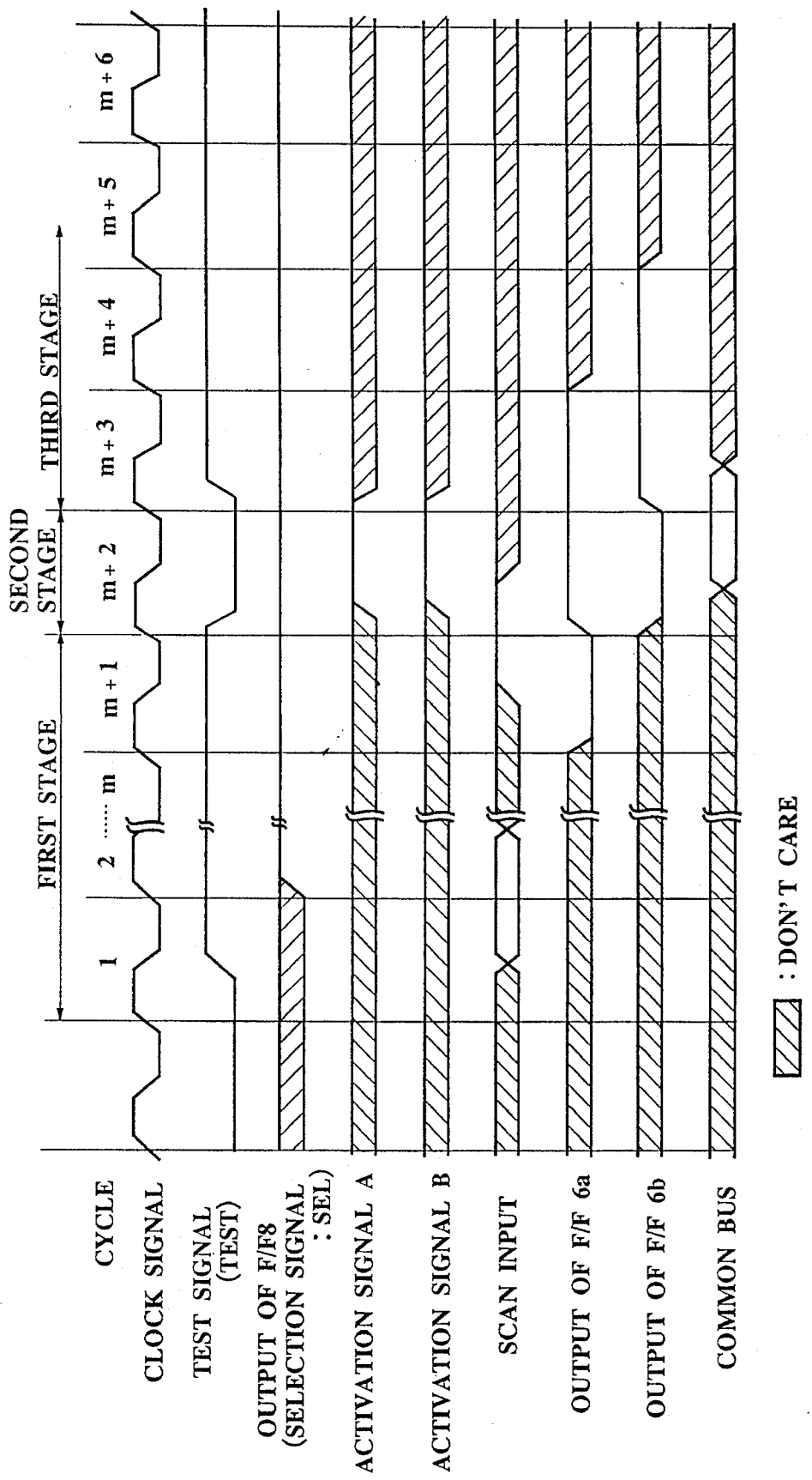
FIG. 3 is a timing chart for the data processing device as shown in FIG. 2.

Next, the test operation of the data processing device including the macro blocks 1a and 1b, the bus control circuit 2, and the F/Fs 6a, 6b and 8 is explained in the context of using a test vector generated by the CAT, with reference to FIG. 3, which shows the timing chart of the data processing device according to the embodiment. In the data processing device, there are three stages described below for the scan test operation.

The test vector generated by the CAT is handled as follows:

When the test vector is generated by the CAT and there is data conflict (bus conflict) or high impedance (bus high impedance) on the common bus 4 according to the state of the bus buffers 3a and 3b for the macro blocks 1a and 1b in the normal operation mode, the data processing device is placed in the test operation mode, as the third operation mode, in which test vectors are generated to use each test operation mode set from an external device by using scan input operation.

Namely, only the bus buffer 3a enters in the active state in the first test operation mode, then the contents of the macro block 1a are provided to the common bus 4 (at this time, the bus buffer 3b is in the inactive state).

On the other hand, only the bus buffer 3b enters in the active state in the second test operation mode, then the contents of the macro block 1b are provided to the common bus 4 (at this time, the bus buffer 3a is in the inactive state).

In the prior art, when bus conflict or bus high impedance occurs, the resultant test data transferred to the common bus from the macro blocks 1a and 1b could not be used as useful test vectors. However, there is no bus conflict or bus high impedance in the data processing device according to the present invention. Accordingly, the time for generating test vectors can be reduced and the efficiency of the test vector generation can be increased in the data processing device according to the present invention.

In the first stage (of the scan operation mode) as illustrated in FIG. 3, the test vectors are set in the m F/Fs which are scannable.

In the first cycle of the first stage as shown in FIG. 3, the test signal TEST is set at the high level (H) from the low level. Thereby, in the second cycle in the first stage, the selection signal SEL as the output of the F/F 8 becomes the high level (H), so that the data processing device enters the scan operation mode. The test vectors are set in the macro blocks 1a and 1b, the F/Fs 6a and 6b, and the F/Fs which can be scanned in the bus control circuit 2 (not shown in FIG. 3) through the scan chain.

The outputs of the AND gates 9a and 9b are selected by the selectors 7a and 7b during the second to the m-th cycles, since the selecting signal SEL is in the low state (L). Each output of the AND gates 9a and 9b is in the low state (L) because the low level (L) signal which is inverted from the test signal TEST in the high level (H) by the inverter 10 is provided to one of the input terminals of each of the AND gates 9a and 9b.

Accordingly, the low level (L) signal is provided to a pair of control input terminals 30a and 30b of the bus buffers 3a and 3b. Thereby, both of the bus buffers 3a and 3b enter the high impedance state, so that their outputs are not transferred to the common bus 4, in order to avoid the bus conflict on the common bus 4 by the outputs of the macro blocks 1a and 1b in the test operation mode.

In such a case, the electric potential of the common bus 4 cannot be kept at a constant value because no data is transferred to the common bus 4 (there are no macro blocks which give data to the common bus 4).

In many cases, when an electric potential of a common bus in a CMOS circuit becomes, for example, an intermediate electric potential, a DC current flows in transistors whose input terminals are connected to the common bus. To avoid this DC current flow in the transistors, small transistors which are normally set to the ON state and connected to the common bus are used in an actual case. As an another approach, it is possible that one of the AND gates 9a and 9b can be exchanged for an OR gate and the test signal TEST instead of the reversed test signal $\overline{\text{TEST}}$ can be used to set the state that either the bus buffer 3a or 3b enters in the active state in the scan test operation mode.

Next, in the (m+1)th cycle, the scan input data is entered into the F/F 6a through the input terminal S because the test signal TEST is in the high state. When the scan input data as the scan input is kept at the low level at the start of the (m+1)th cycle, the scan input data at the low level is provided to the F/F 6a, then the output of the F/F 6a is also at the low level.

Next, in the (m+2)th cycle, the scan input data in the low state is transferred into the F/F 6b through the input terminal S, then maintained in the F/F 6b. On the other hand, when the scan input as the scan vector is at the high level in the (m+2)th cycle, as shown in FIG. 3, the scan input at the high level is provided to the F/F 6a, then maintained.

Next, the test signal TEST enters the low level from the high level. Then the second stage, in which the test operation is carried out, starts. In the (m+2)th cycle of the second stage, when the test signal TEST enters the low level (L), the output of the inverter 10 enters the high level (H) and one of the inputs of each of the AND gates 9a and 9b enters the high level (H). At this time, the outputs of the AND gates 9a and 9b become high level and low level respectively, because the outputs of the F/Fs 6a and 6b as another input of each of the AND gates 9a and 9b are at the high level (H) and the low level (L), respectively. Moreover, the selectors 7a and 7b enter the test operation mode in which they select the outputs of the AND gates 9a and 9b, because the selecting signal SEL is maintained at the high level (H). Thereby, the bus buffer 3a enters in the active state and the bus buffer 3b enters in the inactive state.

As shown in FIG. 3, in the (m+3)th cycle, the output of the macro block 1a is transferred to the common bus 4 through the bus buffer 3a. The output is then stored in the register 5 or the registers in the macro blocks 1a an 1b.

Next, when the test signal TEST is changed from the low level (L) to the high level (H), the data processing device enters the third stage (the scan operation mode), in which the resultant test data are read out to the outside of the device to analyze whether the device is fault free or not.

At the beginning of the third stage, the resultant test data stored in the scannable F/Fs and registers on the scan chain is transferred out of the data processing device for analysis (in particular, the output of the macro block 1a is stored in the resister 5 or the registers in the macro blocks 1a an 1b through the common bus 4 and the output of the bus control circuit 2 is stored in the F/Fs 6a and 6b). In addition, a next scan test vector can also be input to the scan chain from outside the data processing device together with the readout operation for the resultant test data in the third stage.

Therefore, the time needed for the test operation can be reduced because the first stage for the test vector and the third stage for the next test vector are carried out at the same time.

Similarly, in order to let only the output of the macro block 1b be transferred to the common bus 4, the scan input is set at the high level in the m-th cycle and set at the low level in the (m+1)th cycle, then the output of the F/Fs 6a and 6b are set at the low level and the high level in the (m+2)th cycle, respectively.

Thus, in the embodiment described above, whatever activation signals A and B are output from the bus control circuit 2, the outputs of the macro blocks 1a and 1b are obtained by the control of the outputs of the F/Fs 6a and 6b, which are set by the scan input through the input terminal S of the F/F 6a without data conflict or high impedance on the common bus.

Accordingly, all of the test vectors generated by the CAT can be utilized so that the efficiency of the test vector generation is much increased. By generating test vectors using the CAT, under the condition that the exclusive OR of the outputs of the F/Fs 6a and 6b is set at the high level (H), the efficiency of the test vector generation can be more improved.

Finally, some precautions to be taken in the present embodiment described above will be explained.

In the embodiment, when the test signal TEST is changed from the low level to the high level to input the first test vector to the scan chain, the output of the F/F 8 (the selecting signal SEL) enters the high level and the output of the F/F 8 can change to the low level only when the reset signal is input to the reset terminal R of the F/F 8.

Accordingly, the test operation for the macro blocks 1a and 1b, and the bus control circuit 2 is carried out in the test operation mode in which the bus buffers 3a and 3b are controlled only by the F/Fs 6a and 6b. Therefore, the test operation for a logical path through which the bus control circuit 2 controls the bus buffers 3a and 3b cannot be executed.

However, the test operation for these logical paths can be easily carried out in the normal operation mode.

When there are many macro blocks connected to the common bus 4 so that the test control operation is complicated and it is desirable that the above paths are surely tested, the test operation may require the test signal TEST and the selecting signal SEL to be controlled independently by an external element in order to execute the test surely. The present invention includes the scope described above.

The scope of this invention is not limited to the data processing device with a test circuit as shown in FIG. 2, but includes many variations that will be obvious to one skilled in the art.

For example, in the case where two or more macro blocks are connected to the common bus, test vectors may be generated by the CAT under the condition where one of the outputs of scannable F/Fs, each provided for the output control logic of one of the macro blocks, is set at the high level. Moreover, the number of common buses may be one or more.

In the embodiment described above, the output of one of the macro blocks 1a and 1b is transferred into the resister 5 or registers in the macro blocks 1a and 1b, then it is transferred to the outside of the data processing device for analyzed thereof. In some cases, the output may be directly transferred to the outside of the data processing device.

Moreover, in the present embodiment, the test vectors are set and then read out from the data processing device for external analysis under the control of the scan design method. But this setting test vectors and read out thereof may be carried out in the one cycle.

Various modifications will become possible for those skilled in the art after the teaching of the present disclosure without departing from the scope thereof.

What is claimed is:

1. A data processing device with a test circuit operable in a normal operation mode and a test operation mode, comprising:

a plurality of functional element means, each functional element means having an output control means for controlling whether or not an output of the functional element means is transferred;

a common bus for connection to the functional element means, through which the outputs of the functional element means are transferred to each other;

first selection control means for selecting the output control means of a selected one of the functional element means and for transferring the output of the functional element means belonging to the selected output control means to the common bus under the normal operation mode according to control data transferred from an internal device in the data processing device;

second selection control means for selecting the output control means of a selected one of the functional element means to be tested and for transferring to the common bus the output of the selected functional element means through a selected output means under the test operation mode according to control data transmitted from an external means of said data processing device; and mode setting means for controlling whether the data processing device is in the normal operation mode or the test operation mode, wherein the second selection control means comprises a selecting flip-flop corresponding to each functional element means, an output of the selecting flip-flop being provided to the output control means of the corresponding functional element means.

2. A data processing device according to claim 1, wherein the mode setting means comprises a mode setting flip-flop, and selectors.

3. A data processing device according to claim 2, wherein the selecting flip-flop can select a scan operation mode in which test data is set in the selecting flip-flop, or operate in the test operation mode in which the functional element corresponding to the test data outputs results of the testing to the common bus.

* * * * *